United States Patent
Nakashima et al.

(10) Patent No.: US 8,269,463 B2
(45) Date of Patent: Sep. 18, 2012

(54) BATTERY ABNORMALITY DETECTION CIRCUIT AND POWER SUPPLY DEVICE

(75) Inventors: Takuya Nakashima, Osaka (JP); Takuma Iida, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/142,257

(22) PCT Filed: Mar. 4, 2010

(86) PCT No.: PCT/JP2010/001502
§ 371 (c)(1),
(2), (4) Date: Jun. 24, 2011

(87) PCT Pub. No.: WO2010/109784
PCT Pub. Date: Sep. 30, 2010

(65) Prior Publication Data
US 2011/0254559 A1 Oct. 20, 2011

(30) Foreign Application Priority Data
Mar. 24, 2009 (JP) ................. 2009-071540

(51) Int. Cl.
*H02J 7/00* (2006.01)
*G01N 27/416* (2006.01)
(52) U.S. Cl. ...................... 320/132; 324/430
(58) Field of Classification Search .................. 320/132; 324/425–434
See application file for complete search history.

(56) References Cited

U.S. PATENT DOCUMENTS

| | | | |
|---|---|---|---|
| 6,850,038 B2 * | 2/2005 | Arai et al. ................. | 320/132 |
| 2003/0052646 A1 | 3/2003 | Minamiura et al. | |
| 2004/0008031 A1 * | 1/2004 | Arai et al. ................. | 324/429 |
| 2007/0200567 A1 * | 8/2007 | Mizuno et al. ............. | 324/430 |
| 2009/0295399 A1 * | 12/2009 | Ueda et al. ................ | 324/429 |
| 2010/0156356 A1 * | 6/2010 | Asakura et al. ........... | 320/148 |

FOREIGN PATENT DOCUMENTS

| | | |
|---|---|---|
| JP | 2000-215923 | 8/2000 |
| JP | 2003-204627 | 7/2003 |
| JP | 2008-253129 | 10/2008 |

* cited by examiner

*Primary Examiner* — Richard V Muralidar
(74) *Attorney, Agent, or Firm* — McDermott Will & Emery LLP

(57) ABSTRACT

A battery abnormality detection circuit includes: a SOC detection unit that detects a SOC of a secondary battery; an internal resistance detection unit that detects an internal resistance value of the secondary battery; a first state acquisition unit that acquires a first SOC and a first resistance value at a predetermined first timing; a second state acquisition unit that acquires a second SOC and a second resistance value at a second timing a storage unit that stores in advance relationship information indicating a correspondence relationship between a SOC and an internal resistance value of the secondary battery; a reference variation value setting unit that sets a reference variation value indicating an amount of variation from an internal resistance value corresponding to the first SOC to an internal resistance value corresponding to the second SOC on the basis of the relationship information stored in the storage unit; and a determination unit that determines that an abnormality has occurred in the secondary battery when an amount of variation from the first resistance value to the second resistance value is different from an amount of variation indicated by the reference variation value that has been set by the reference variation value setting unit.

7 Claims, 6 Drawing Sheets

BATTERY ABNORMALITY DETECTION CIRCUIT AND POWER SUPPLY DEVICE

RELATED APPLICATIONS

This application is the U.S. National Phase under 35 U.S.C. §371 of International Application No. PCT/JP2010/001502, filed on Mar. 4, 2010, which in turn claims the benefit of Japanese Application No. 2009-071540, filed on Mar. 24, 2009, the disclosures of which Applications are incorporated by reference herein.

TECHNICAL FIELD

The present invention relates to a battery abnormality detection circuit for a second battery that can be used in a wide variety of fields, e.g. mobile devices such as cellular phones and personal computers, power tools such as electric tools and vacuum cleaners, power driven apparatuses such as electric automobiles, electric industrial vehicles, electric bikes, power-assisted bicycles, power-driven wheel chairs, and electric robots, and system power supply sources such as load leveling devices, peak shift devices, and backup devices, and also to a power supply device using same.

BACKGROUND ART

A variety of devices that detect an abnormality of a secondary battery on the basis of variations in battery properties during repeated charging and discharging and long-term storage have been suggested. A device that detects a leakage abnormality of a secondary battery by comparing a variation amount of an internal resistance of a secondary battery caused by charging for a predetermined time with a reference value has been suggested as one of such devices (see, for example, Patent Document 1).

According to the technique described in Patent Document 1, a leakage abnormality that has occurred in a battery is detected by using a battery property such that a variation amount of an internal resistance in the battery having an abnormality becomes larger than that in a normal secondary battery.

However, since the internal resistance of a secondary battery varies in response to a state of charge (SOC), a variation amount of internal resistance caused by charging for a predetermined time differs depending on a SOC at the time the charging has been started, even in a normal secondary battery. The resultant problem is that where an abnormality is detected by comparing a variation amount of an internal resistance of a secondary battery caused by charging for a predetermined time with a reference value, the abnormality is difficult to detect with high accuracy.

PATENT LITERATURE

Patent Document 1: Japanese Patent Application Publication No. 2003-204627

SUMMARY OF THE INVENTION

It is an object of the present invention to provide a battery abnormality detection circuit capable of increasing the accuracy of abnormality detection in a secondary battery and also a power supply device using the circuit.

A battery abnormality detection circuit according to one aspect of the invention includes a SOC detection unit that detects a SOC of a secondary battery; an internal resistance detection unit that detects an internal resistance value of the secondary battery; a first state acquisition unit that acquires, at a predetermined first timing, a SOC detected by the SOC detection unit as a first SOC and acquires an internal resistance value detected by the internal resistance detection unit as a first resistance value; a second state acquisition unit that acquires a SOC detected by the SOC detection unit as a second SOC and acquires an internal resistance value detected by the internal resistance detection unit as a second resistance value at a second timing at which at least a preset time has elapsed since the first timing; a storage unit that stores in advance relationship information indicating a correspondence relationship between a SOC and an internal resistance value of the secondary battery; a reference variation value setting unit that sets a reference variation value indicating an amount of variation from an internal resistance value corresponding to the first SOC to an internal resistance value corresponding to the second SOC on the basis of the relationship information stored in the storage unit; and a determination unit that determines that an abnormality has occurred in the secondary battery when an amount of variation from the first resistance value to the second resistance value is different from an amount of variation indicated by the reference variation value that has been set by the reference variation value setting unit.

The power supply device according to another aspect of the present invention includes the above-described battery abnormality detection circuit and secondary battery.

BRIEF DESCRIPTION OF THE DRAWINGS

FIG. 6 are graphs showing examples of correspondence relationship between a SOC and an internal resistance value of a lithium secondary battery.

DESCRIPTION OF EMBODIMENTS

Figure 1:
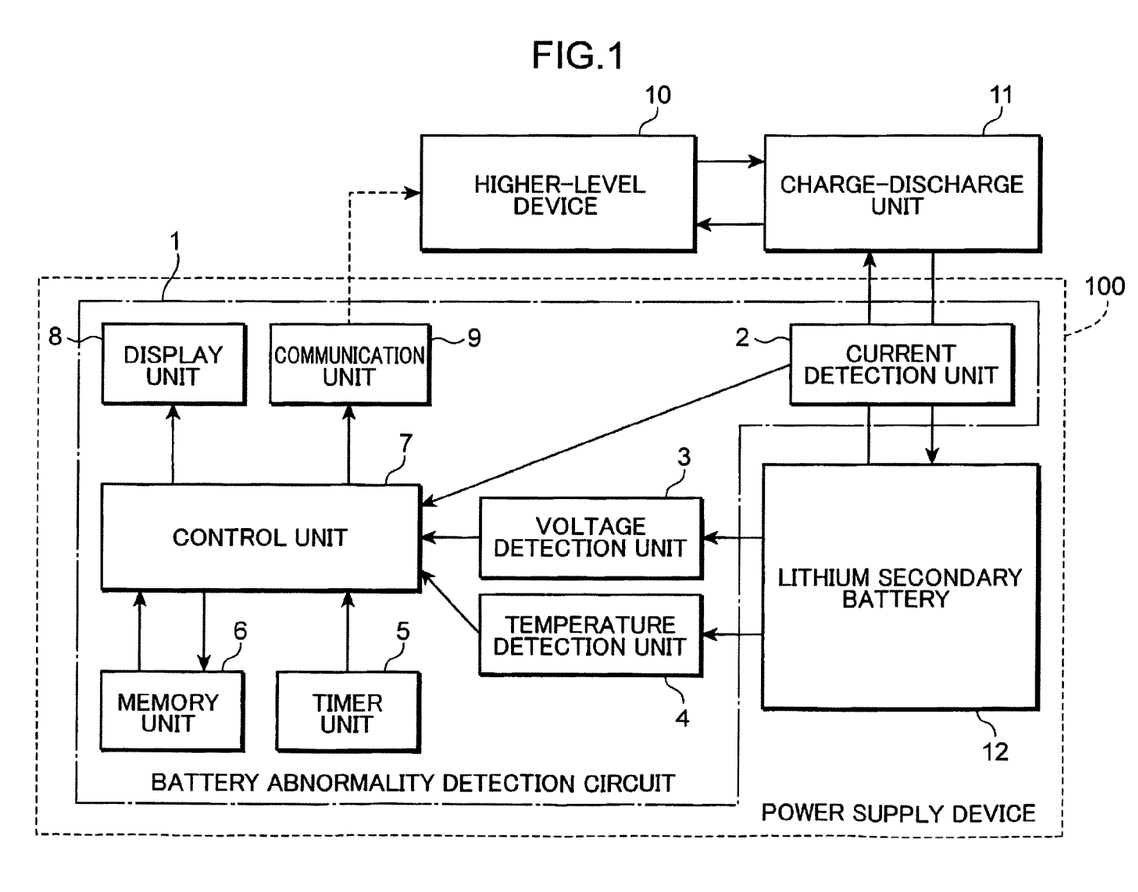
FIG. 1 is a block diagram illustrating an example of a battery abnormality detection circuit according to one embodiment of the present invention and a power supply device using the battery abnormality detection circuit.

An embodiment of the present invention will be explained below with reference to the appended drawings. Components assigned with like reference symbols in the drawings are like components and explanation thereof is herein omitted. FIG. 1 is a block diagram showing an example of a battery abnormality detection circuit and a power supply device using the battery abnormality detection circuit according to an embodiment of the present embodiment.

A power supply device 100 shown in FIG. 1 is constituted by a battery abnormality detection circuit 1 and a lithium secondary battery 12. The power supply device 100 may be constituted, for example, as a battery pack, a backup power supply device, part of a device carrying a battery, or as another power supply device. In addition to a lithium ion secondary battery, a nickel hydride secondary battery, a lead battery, or other secondary batteries can be used as the lithium secondary battery 12.

The lithium secondary battery 12, a higher-level device 10, and a charge-discharge unit 11 are connected to the battery abnormality detection circuit 1. The higher-level device 10 is a main unit of a battery-carrying device that is operated by power supplied from the lithium secondary battery 12, such as a portable personal computer or a cellular phone. The charge-discharge unit 11 is a charge-discharge circuit that charges the lithium secondary battery 12 by supplying electric current thereto or receives power supply from the lithium secondary battery 12 and supplies the power to the higher-level device 10.

The battery abnormality detection circuit 1, lithium secondary battery 12, higher-level device 10, and charge-discharge unit 11 are configured integrally and constitute a battery-carrying device. The battery abnormality detection circuit 1 may be configured as part of the higher-level device 10 and may be configured for example as part of a battery pack including the lithium secondary battery 12.

The battery abnormality detection circuit 1 includes a current detection unit 2 that detects a current value Id of a charge-discharge current inputted by the charge-discharge unit 11 to the lithium secondary battery 12 and outputted therefrom, a voltage detection unit 3 that detects a voltage value Vt of a terminal voltage of the lithium secondary battery 12, a temperature detection unit 4 that detects a temperature T of the lithium secondary battery 12, a timer unit 5 that performs time count, a memory unit 6 (storage unit), a control unit 7, a display unit 8 that displays abnormality information, and a communication unit 9 that sends the abnormality information to the higher-level device 10.

The current detection unit 2 is constituted for example by using a current sensor such as a shunt resistor or a current transformer. The current detection unit 2 indicates a current value in the direction of charging the lithium secondary battery 12 with a plus and a current value in the direction of discharging the lithium secondary battery 12 with a minus.

The voltage detection unit 3 is constituted by using for example an analog-digital converter. The temperature detection unit 4 is constituted by using for example a temperature sensor such as a thermocouple or a thermistor. The timer unit 5 may be constituted by using for example a timer circuit or may be realized by a software sequence.

The memory unit 6 is a memory unit including for example a nonvolatile ROM (Read Only Memory) or a RAM (Random Access Memory) storing abnormality information. For example, a relationship information table indicating a correspondence relationship between a SOC (State of Charge) and an internal resistance value of the lithium secondary battery 12 or a SOC conversion table for converting a terminal voltage of the lithium secondary battery 12 into a SOC is stored as a LUT (Look Up Table) in advance in the ROM. The memory unit 6 may be incorporated for example, in the control unit 7.

Figure 6A:
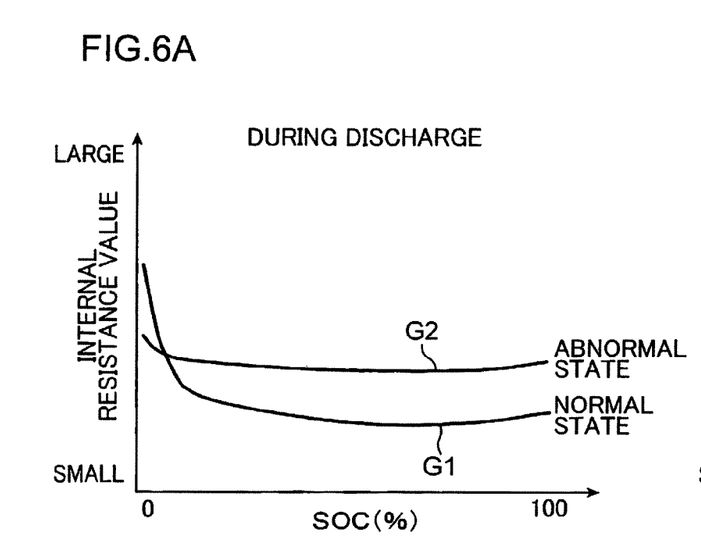
FIG. 6A shows a graph obtained during charging and FIG. 6B shows a graph obtained during discharging.
Figure 6B:
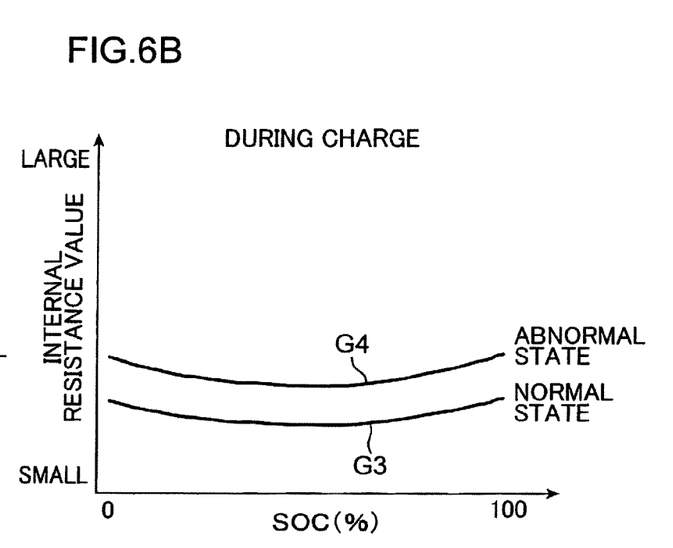

FIG. 6 are graphs illustrating examples correspondence relationship between a SOC and an internal resistance value of the lithium secondary battery 12. FIG. 6A shows a graph obtained during discharging and FIG. 6B shows a graph obtained during charging. FIGS. 6A and 6B show graphs G1, G3 illustrating properties in the case in which the lithium secondary battery 12 is normal and graphs G2, G4 illustrating properties in the case in which the lithium secondary battery 12 is abnormal.

As shown by graph G1 in FIG. 6A and graph G3 in FIG. 6B, the variation in the internal resistance value related to the variation in the SOC is larger during discharging than during charging.

For example, a LED (Light Emitting Diode) or a liquid display device can be used as the display unit 8.

The current detection unit 2, voltage detection unit 3, temperature detection unit 4, timer unit 5, and memory unit 6 are connected to the control unit 7, and information obtained by each of the aforementioned units is sent to the control unit 7. Abnormality information indicating an abnormal state of the lithium secondary battery 12 is generated by the control unit 7 on the basis of information sent from each of the aforementioned units, and the generated abnormality information is stored in the memory unit 6. The abnormality information is sent to and displayed on the display unit 8 or sent to the higher-level device 10 via the communication unit 9.

Figure 2:
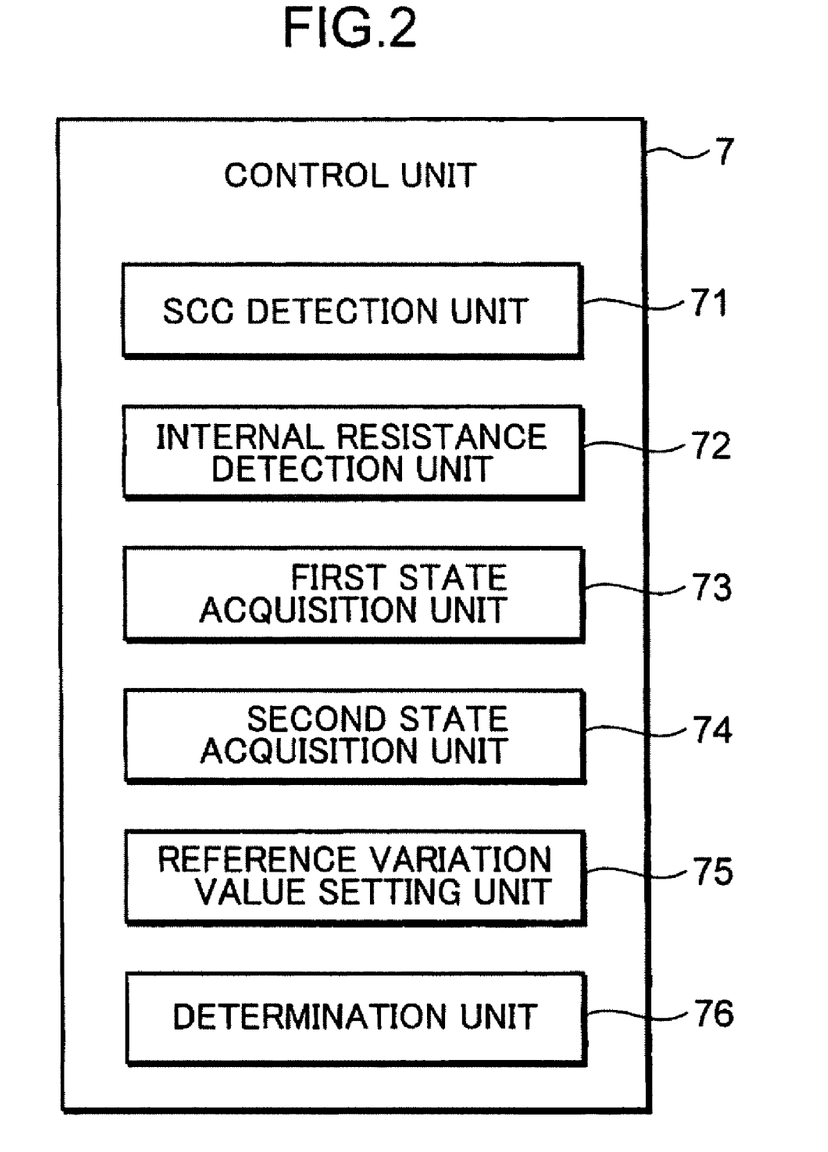
FIG. 2 is a block diagram illustrating a configuration example of the control unit shown in FIG. 1.

FIG. 2 is a block diagram illustrating a configuration example of the control unit 7 shown in FIG. 1. The control unit 7 is constituted, for example, by a CPU (Central Processing Unit) executing a predetermined computational processing, a storage unit such as a ROM that stores a predetermined control program or a RAM that stores data temporarily, and peripheral circuits thereof. By executing the control program stored in the ROM, the control unit 7 functions as a SOC detection unit 71, an internal resistance detection unit 72, a first state acquisition unit 73, a second state acquisition unit 74, a reference variation value setting unit 75, and a determination unit 76.

The SOC detection unit 71 detects a SOC (State of Charge) of the lithium secondary battery 12. More specifically, in a lithium ion secondary battery, there is a correlation between a terminal voltage value Vt and a SOC. Accordingly, a look up table indicating the correspondence relationship of the terminal voltage value Vt and SOC of the lithium secondary battery 12 is stored as a SOC conversion table in the memory unit 6.

The SOC detection unit 71 detects a SOC of the lithium secondary battery 12 by converting the terminal voltage value Vt detected by the voltage detection unit 3 into a SOC with reference to the SOC conversion table stored in the memory unit 6.

Further, a secondary battery such as a lithium ion secondary battery has a property such that the terminal voltage decreases with the increase in temperature. Accordingly, for example, a look up table indicating a correction value (addition value) for correcting the SOC corresponding to the terminal voltage that has been set such that the correction amount (addition amount) increases with the increase in temperature so as to compensate the variation in terminal voltage caused by temperature is stored in advance as a temperature correction table in the memory unit 6.

The SOC detection unit 71 refers to the temperature correction table and acquires a correction value associated with a temperature T detected by the temperature detection unit 4. Then, the SOC detection unit 71 corrects the SOC by adding the correction value obtained by using the temperature correction table to the SOC obtained by using the SOC conversion table as described hereinabove and outputs the corrected SOC to the first state acquisition unit 73 and the second state acquisition unit 74.

It is not always necessary for the SOC detection unit 71 to perform correction of the SOC according to the temperature, and the SOC obtained by using the SOC conversion table may be directly outputted to the first state acquisition unit 73 and the second state acquisition unit 74.

Further, a variety of other methods can be used for detecting a SOC: more specifically, the SOC detection unit 71 may calculate an accumulated charge amount of the lithium secondary battery 12 by integrating the charge-discharge current value Id detected by the current detection unit 2 and calculate a percentage of the accumulated charge amount to the full charge capacity of the lithium secondary battery 12 as the SOC.

Figure 3:
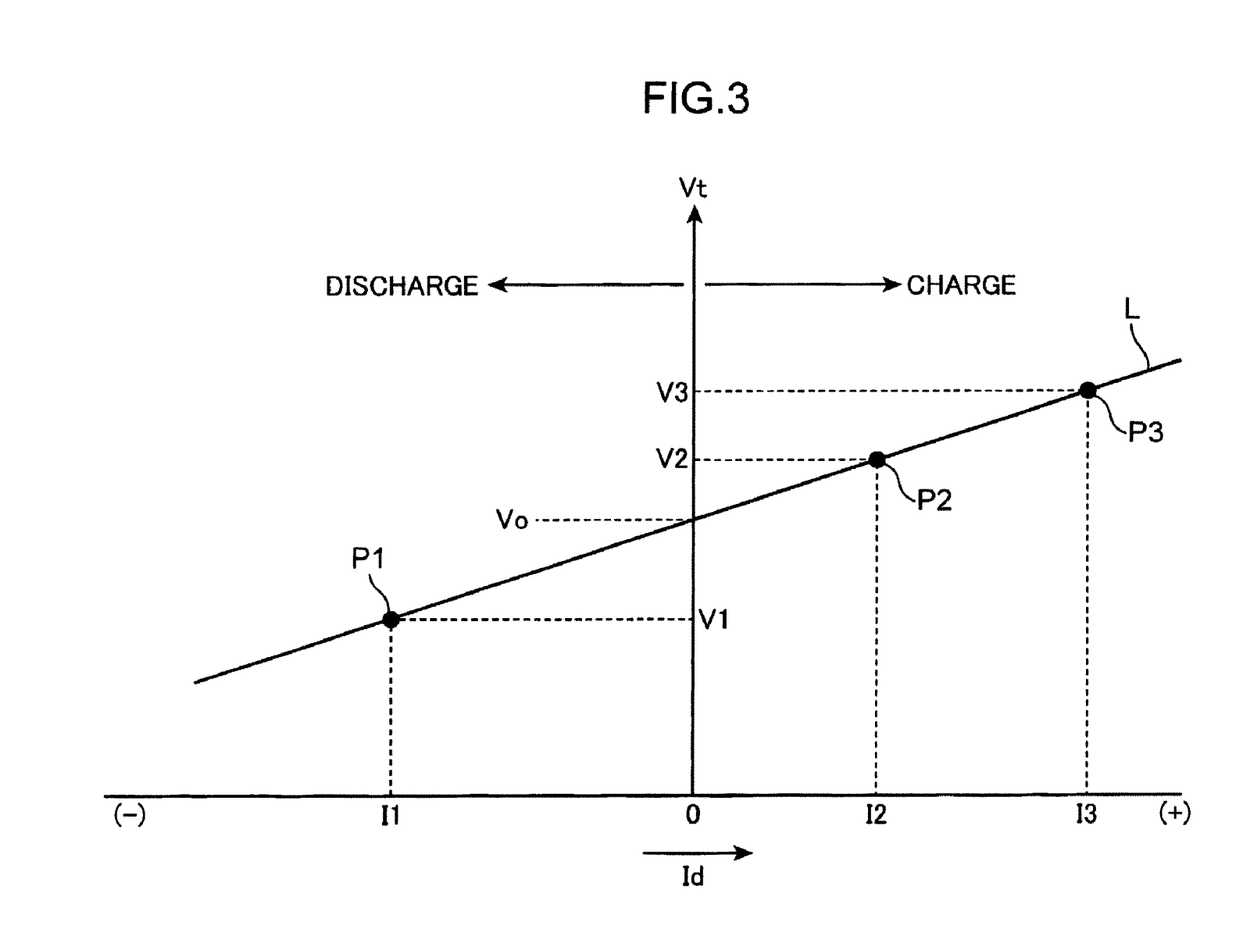
FIG. 3 is an explanatory drawing illustrating an example of a method for detecting an internal resistance value with the internal resistance detection unit shown in FIG. 2.

The internal resistance detection unit 72 detects an internal resistance value R of the lithium secondary battery 12. FIG. 3 is an explanatory drawing illustrating an example of a method for detecting the internal resistance value R with the internal resistance detection unit 72 shown in FIG. 2.

The internal resistance detection unit 72 acquires a plurality of sets of a terminal voltage value Vt and a charge-discharge current value Id and generates a regression line. FIG. 3 shows an example in which data P1 with a charge-discharge current value Id of I1 and a terminal voltage value Vt of V1, data P2 with a charge-discharge current value Id of I2 and a terminal voltage value Vt of V2, and data P3 with a charge-discharge current value Id of I3 and a terminal voltage value Vt of V3 are acquired and a regression line L is generated from the data P1, P2, and P3.

The regression line L obtained in the above-described manner is represented by Equation (1) below, and a coefficient R indicating an inclination thereof is obtained as an internal resistance value R of the lithium secondary battery 12.

$$Vt = R \times Id + V_0 \tag{1}$$

In order to obtain the regression line L, it is necessary to acquire a plurality of different sets of terminal voltage values Vt and charge-discharge current values Id. However, for example, in an electric automobile, the charge-discharge current changes frequently in response to vehicle acceleration or deceleration and a road state, and in a wind power generation system, a charge-discharge current changes frequently in response to variations in a wind speed. Therefore, a plurality of different sets of terminal voltage values Vt and charge-discharge current values Id that are necessary to obtain the regression line L can be acquired within a period of, for example, about 1 min.

In the internal resistance detection unit 72, for example, an internal resistance table showing the relationship between a temperature and an internal resistance value of the lithium secondary battery 12 is stored in advance in a ROM or the like, and the internal resistance value R is estimated by converting the temperature T detected by the temperature detection unit 4 into the internal resistance value R of the lithium secondary battery 12 by using the internal resistance table.

The first state acquisition unit 73 acquires the SOC of the lithium secondary battery 12 obtained with the SOC detection unit 71 as a $SOC_1$ (first SOC) and acquires the internal resistance value R detected by the internal resistance detection unit 72 as a first resistance value $R_1$ at a predetermined first timing T1 within a period in which the lithium secondary battery 12 is subjected to discharge. The first state acquisition unit 73 then initiates counting of the elapsed time with the timer unit 5.

The second state acquisition unit 74 acquires the SOC of the lithium secondary battery 12 obtained with the SOC detection unit 71 as a $SOC_2$ (second SOC) and acquires the internal resistance value R detected by the internal resistance detection unit 72 as a second resistance value $R_2$ when the time count of the timer unit 5 is equal to or longer than a set time Ts that has been set in advance, for example 1 hour, that is, at a second timing T2 such that an interval equal to or longer than the set time Ts that has been set in advance has elapsed since the first timing T1 and the lithium secondary battery 12 is subjected to discharge.

The first state acquisition unit 73 and the second state acquisition unit 74 determine that the lithium secondary battery 12 is being charged for example when the charge-discharge current value Id detected by the current detection unit 2 is positive and determine that the lithium secondary battery 12 is being discharged when this value is negative.

A time in which the SOC of the lithium secondary battery 12 is expected to change in the actual usage state may be appropriately set as the set time Ts, and strict time accuracy is not required for the set time.

The first timing T1 and the second timing T2 include detection time of the internal resistance value R by the internal resistance detection unit 72 and a processing time of the first state acquisition unit 73 and the second state acquisition unit 74 and have a certain time width, but the timing at which the count of the set time Ts is started may be at the beginning of the first timing T1 or after the end of the first timing T1, or can generally stipulate a time interval from the first timing T1 to the second timing T2.

The first state acquisition unit 73 and the second state acquisition unit 74 are not necessarily limited to an example in which whether the lithium secondary battery 12 is in the discharge state or charge state is determined on the basis of the charge-discharge current value Id detected by the current detection unit 2. The first state acquisition unit 73 and the second state acquisition unit 74 can perform the detection by a variety of means, for example, by receiving information indicating whether the lithium secondary battery 12 is being discharged or charged from the charge-discharge unit 11 via the higher-level device 10 and the communication unit 9.

The reference variation value setting unit 75 acquires the internal resistance reference value $Rx_1$ associated with the $SOC_1$ obtained by the first state acquisition unit 73 and the internal resistance reference value $Rx_2$ associated with the $SOC_2$ obtained by the second state acquisition unit 74, with reference to the relationship information table stored in the memory unit 6.

The reference variation value setting unit 75 uses Equations (2) and (3) below when $SOC_1 \geq SOC_2$, uses Equations (4) and (5) below when $SOC_1 < SOC_2$ and calculates and sets a reference variation upper limit value Xu and a reference variation lower limit value Xd that are reference variation values serving as indicators indicating an amount of variation from the internal resistance reference value $Rx_1$, to the internal resistance reference value $Rx_2$.

When $SOC_1 \geq SOC_2$, $$Xu = (Rx_2/Rx_1) + Cx \tag{2}$$

$$Xd = (Rx_2/Rx_1) - Cx \tag{3};$$

when $SOC_1 < SOC_2$, $$Xu = (Rx_1/Rx_2) + Cx \tag{4}$$

$$Xd = (Rx_1/Rx_2) - Cx \tag{5}$$

where Cx is a value representing an error of the reference variation value occurring due to a spread in properties of the lithium secondary batteries 12 or a measurement error.

The determination unit 76 calculates a variation value X that is an indicator indicating an amount of variation from the first resistance value $R_1$ acquired by the first state acquisition unit 73 to the second resistance value $R_2$ acquired by the second state acquisition unit 74, for example, by using Equation (6) presented below when $SOC_1 \geqq SOC_2$ and using Equation (7) presented below when $SOC_1 < SOC_2$.

When $SOC_1 \geqq SOC_2$, $$X = R_2/R_1 \quad (6);$$

when $SOC_1 < SOC_2$, $$X = R_1/R_2 \quad (7).$$

When the variation value X is different from the reference variation value set by the reference variation value setting unit 75, that is, outside a range from the reference variation upper limit value Xu to the reference variation lower limit value Xd, the determination unit 76 determines that an abnormality has occurred in the lithium secondary battery 12, and when the variation value X is within the range from the reference variation upper limit value Xu to the reference variation lower limit value Xd, the determination unit 76 determines that no abnormality has occurred, and the determination unit 76 stores the determination result as abnormality information in the memory unit 6, or displays the information at the display unit 8, or transmits it by the communication unit 9 to the higher-level device 10.

As shown in FIGS. 6A and 6B, the relationships between the SOC and the internal resistance value in the normal state (graphs G1, G3) and the relationship between the SOC and the internal resistance value in the abnormal state (graphs G2, G4) can be shifted parallel to each other or a region can be present therein. In such a case, where the variation value X is evaluated as an assumed difference ($R_2 - R_1$ or $R_1 - R_2$) between values before and after the variation, it is unlikely that a difference in the variation value X be observed between the normal state and abnormal state, and the occurrence of abnormality can be difficult to detect.

However, where the variation value X is evaluated as a ratio of values before and after the variation, as shown in Equations (6) and (7), a difference in the variation value X easily occurs between the normal state and abnormal state and therefore the occurrence of abnormality can be easily detected even in the case of an internal resistance value characteristic such as shown in graphs G2 and G4 in the abnormal state.

Figure 4:
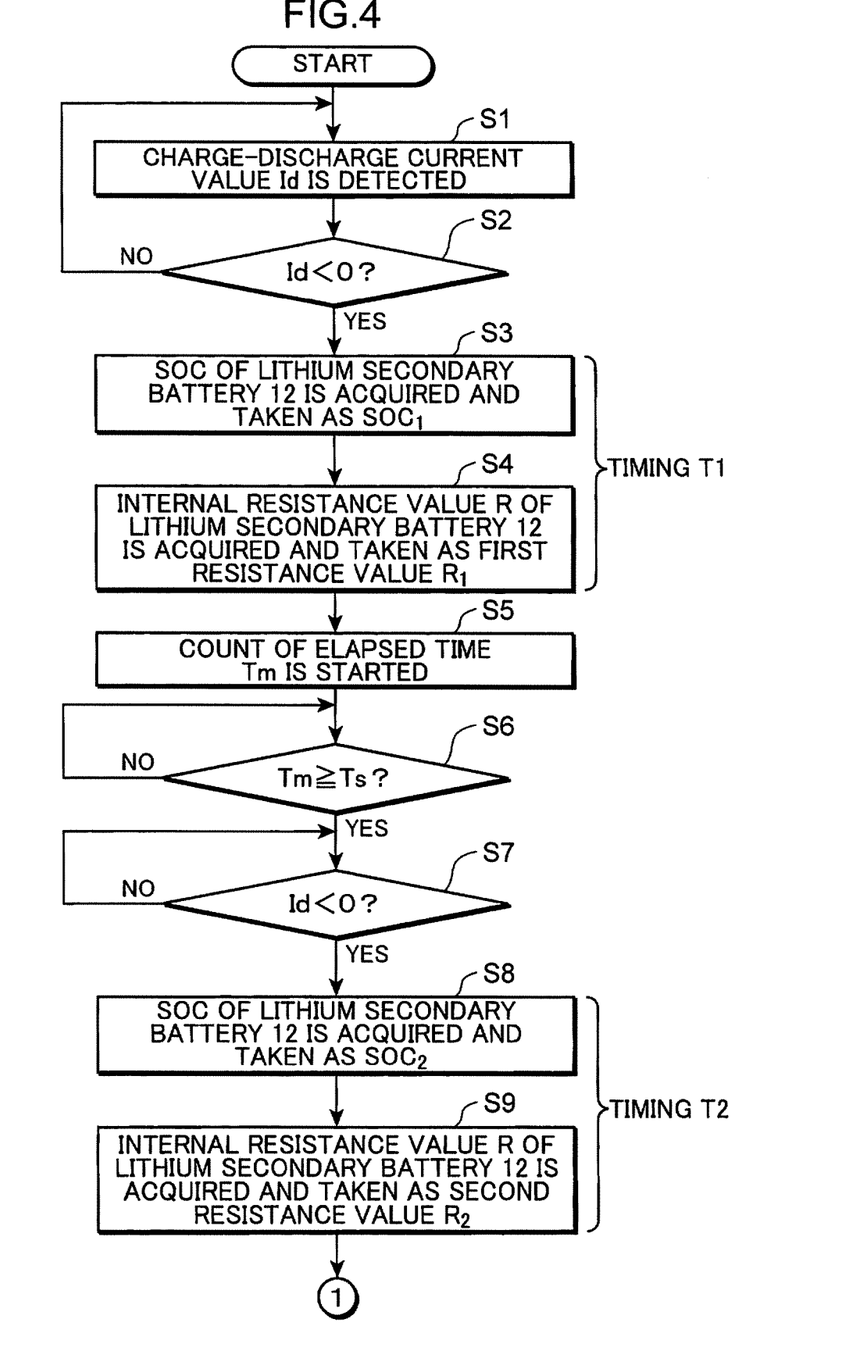
FIG. 4 is a flowchart illustrating an operation example of the battery abnormality detection circuit shown in FIG. 1.
Figure 5:
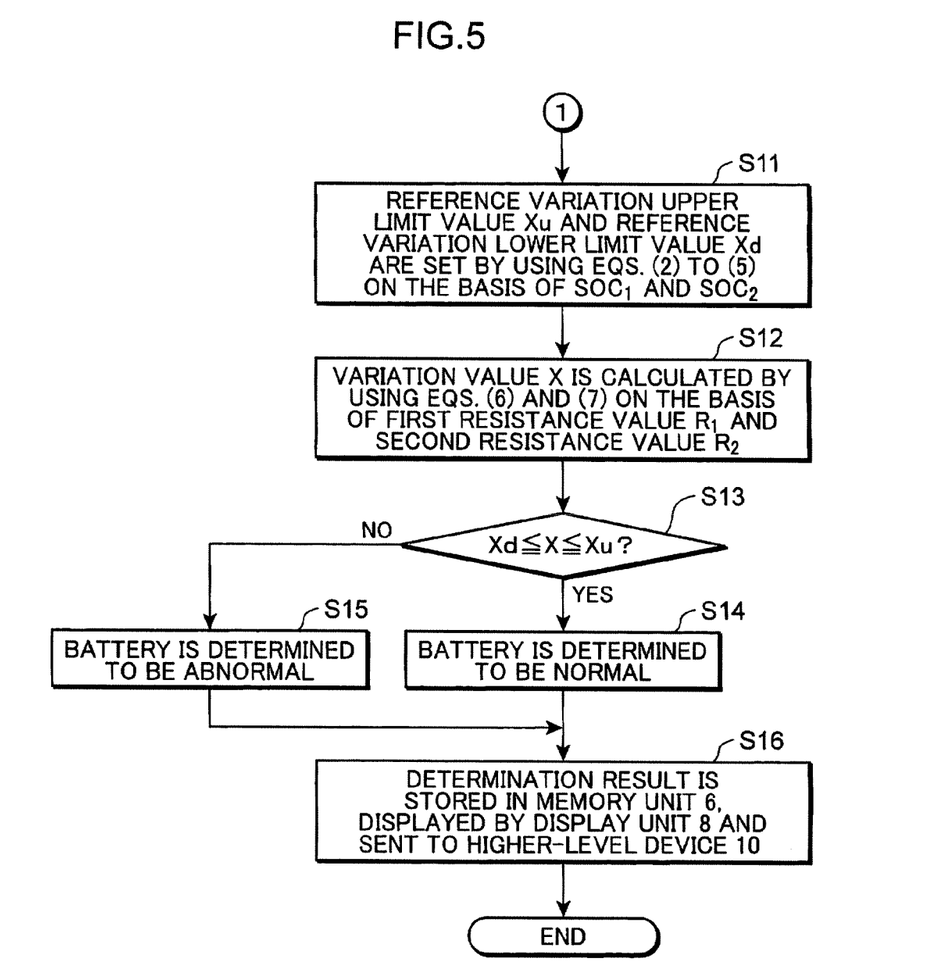
FIG. 5 is a flowchart illustrating an operation example of the battery abnormality detection circuit shown in FIG. 1.

The operation of the power supply device 100 shown in FIG. 1 will be explained below. FIGS. 4 and 5 are flowcharts illustrating an operation example of the battery abnormality detection circuit 1 shown in FIG. 1. Where abnormality detection of the lithium secondary battery 12 is started by the battery abnormality detection circuit 1, first, a charge-discharge current value Id of the current flowing in the lithium secondary battery 12 is detected by the current detection unit 2 (step S1).

Then, the charge-discharge current value Id is compared with zero by the first state acquisition unit 73 (step S2), and where the charge-discharge current value Id is equal to or higher than zero (NO in step S2), the lithium secondary battery 12 is determined not to be in the discharge state and the processing flow again moves to step S1. However, where the charge-discharge current value Id is less than zero (negative value) (YES in step S2), the lithium secondary battery 12 is determined to be in a discharge state and the processing flow moves to step S3. The execution timing of steps S3 and S4 below corresponds to the timing T1.

A SOC of the lithium secondary battery 12 at the timing T1 is then calculated by the SOC detection unit 71. The SOC thus obtained is acquired as the $SOC_1$ by the first state acquisition unit 73 (step S3).

The internal resistance value R of the lithium secondary battery 12 at the timing T1 is then detected by the internal resistance detection unit 72. The internal resistance value R thus obtained is acquired as the first resistance value $R_1$ by the first state acquisition unit 73 (step S4).

The count of the elapsed time Tm is then started by the timer unit 5 (step S5). The elapsed time Tm counted by the timer unit 5 is then compared by the second state acquisition unit 74 with the set time Ts (step S6), and where an interval equal to or longer than the set time Ts has elapsed since the timing T1 and the elapsed time Tm is equal to or longer than the set time Ts (YES in step S6), the processing flow moves to step S7.

In step S7, the second state acquisition unit 74 compares the charge-discharge current value Id with zero, and where the charge-discharge current value Id is equal to or greater than zero (NO in step S7), the lithium secondary battery 12 is determined not to be in the discharge state and the step S7 is repeated. Where the charge-discharge current value Id is less than zero (a negative value) (YES in step S7), the lithium secondary battery 12 is determined to be in the discharge state and the processing flow moves to step S8. The execution timing of steps S8 and S9 below corresponds to the timing T2.

Then, in step S8, a SOC of the lithium secondary battery 12 at the timing T2 is calculated by the SOC detection unit 71. The SOC thus obtained is then acquired as the $SOC_2$ by the second state acquisition unit 74 (step S8).

The SOC detection unit 71 may calculate and update the SOC of the lithium secondary battery 12 at all times by executing integration of the charge-discharge current value Id in parallel with steps S1 to S16. In steps S3 and S8, the first state acquisition unit 73 and the second state acquisition unit 74 may acquire the new SOC calculated by the SOC detection unit 71 as the $SOC_1$, $SOC_2$ at the respective timings T1, T2.

The internal resistance value R of the lithium secondary battery 12 at the timing T2 is then detected by the internal resistance detection unit 72. The internal resistance value R thus obtained is then acquired as the second resistance value $R_2$ by the second state acquisition unit 74 (step S9).

The reference variation upper limit value Xu and the reference variation lower limit value Xd are then set by the reference variation value setting unit 75 by using Equations (2) to (5) on the basis of the $SOC_1$ obtained by the first state acquisition unit 73 and the $SOC_2$ obtained by the second state acquisition unit 74 (step S11).

The variation value X is then calculated by the determination unit 76 by using Equations (6) and (7) on the basis of the first resistance value $R_1$ and the second resistance value $R_2$ (step S12).

The determination unit 76 then checks whether the variation value X is within the range from the reference variation upper limit value Xu to the reference variation lower limit value Xd (step S13).

The reference variation upper limit value Xu and the reference variation lower limit value Xd are values (indicators) obtained by predicting the internal resistance value R of the lithium secondary battery 12 between the timings T1 and T2 from the $SOC_1$, which is the SOC of the lithium secondary battery 12 at the timing T1, and the $SOC_2$, which is the SOC of the lithium secondary battery 12 at the timing T2.

The variation value X is a value (indicator) representing a variation between the first resistance value $R_1$, which is an internal resistance value of the lithium secondary battery 12 at the timing T1, and the second resistance value $R_2$, which is the internal resistance value of the lithium secondary battery 12 at the timing T2.

Therefore, where no abnormality has occurred in the lithium secondary battery 12, the variation value X can be considered to be within the range from the reference variation upper limit value Xu to the reference variation lower limit value Xd. By contrast, where the variation value X is outside the range from the reference variation upper limit value Xu to the reference variation lower limit value Xd, it can be assumed that an abnormality has occurred in the lithium secondary battery 12.

Where the variation value X is within the range from the reference variation upper limit value Xu to the reference variation lower limit value Xd (YES in step S13), the determination unit 76 determines that the lithium secondary battery 12 is in the normal state (step S14), and where the variation value X is outside the range from the reference variation upper limit value Xu to the reference variation lower limit value Xd (NO in step S13), the determination unit determines that the lithium secondary battery 12 is in the abnormal state (step S15).

The determination unit 76 then stores the determination results obtained in steps S14 and S15, for example in the memory unit 6, to enable subsequent verification thereof, or displays the determination results with the display unit 8 to notify the user of the occurrence of abnormality, or sends the determination results to the higher-level device 10 by the communication unit 9 (step S16).

With the processing of steps S1 to S16, a range serving as a reference for abnormality determination is set as the reference variation upper limit value Xu and the reference variation lower limit value Xd in which SOC is reflected by predicting a variation in the internal resistance value R of the lithium secondary battery 12 between the timings T1 and T2 from the $SOC_1$, which is the SOC of the lithium secondary battery 12 at the timing T1, and the $SOC_2$, which is the SOC of the lithium secondary battery 12 at the timing T2. Therefore, the accuracy of abnormality detection in a secondary battery can be increased over than in the case in which an abnormality is detected by comparing a variation amount of an internal resistance of a secondary battery occurring due to charging within a predetermined time with a reference value as in the background art.

The first state acquisition unit 73 and the second state acquisition unit 74 are not necessarily limited to an example in which the $SOC_1$, first resistance value $R_1$, $SOC_2$, and second resistance value $R_2$ are acquired at a timing during discharging and may have a configuration such that steps S2 and S7 are not executed.

However, properties of lithium ion secondary batteries are such that variations in internal resistance value R are larger during discharging than during charging. Accordingly, where the first state acquisition unit 73 and the second state acquisition unit 74 execute steps S2 and S7 and acquire the $SOC_1$, first resistance value $R_1$, $SOC_2$, and second resistance value $R_2$ at a timing during discharging, a value that can be obtained as the variation value X is larger than that in the case in which the $SOC_1$, first resistance value $R_1$, $SOC_2$, and second resistance value $R_2$ are acquired at a timing during charging. As a result, the accuracy of abnormality detection in a secondary battery can be increased.

Thus, a battery abnormality detection circuit according to one aspect of the invention includes a SOC detection unit that detects a SOC of a secondary battery; an internal resistance detection unit that detects an internal resistance value of the secondary battery; a first state acquisition unit that acquires, at a predetermined first timing, a SOC detected by the SOC detection unit as a first SOC and acquires an internal resistance value detected by the internal resistance detection unit as a first resistance value; a second state acquisition unit that acquires a SOC detected by the SOC detection unit as a second SOC and acquires an internal resistance value detected by the internal resistance detection unit as a second resistance value at a second timing at which at least a preset time has elapsed since the first timing; a storage unit that stores in advance relationship information indicating a correspondence relationship between a SOC and an internal resistance value of the secondary battery; a reference variation value setting unit that sets a reference variation value indicating an amount of variation from an internal resistance value corresponding to the first SOC to an internal resistance value corresponding to the second SOC on the basis of the relationship information stored in the storage unit; and a determination unit that determines that an abnormality has occurred in the secondary battery when an amount of variation from the first resistance value to the second resistance value is different from an amount of variation indicated by the reference variation value that has been set by the reference variation value setting unit.

The power supply device according to another aspect of the present invention includes the above-described battery abnormality detection circuit and secondary battery.

With such a configuration, the first state acquisition unit acquires a SOC as the first SOC, and an internal resistance value as the first resistance value of the secondary battery at the predetermined first timing, and acquires a SOC as the second SOC and an internal resistance value as the second resistance value of the secondary battery at the second timing at which a time equal to or longer that the set time that has been set in advance has elapsed since the first timing. Further, relationship information indicating a correspondence relationship of the SOC and internal resistance value of the secondary battery has been stored in advance by the storage unit. The reference variation value that sets a reference variation value indicating a variation amount from an internal resistance value corresponding to the first SOC to an internal resistance value corresponding to the second SOC is set by the reference variation value setting unit on the basis of the relationship information. When a variation amount from the first resistance value to the second resistance value is different from the variation amount indicated by the reference variation value, the determination unit determines that an abnormality has occurred in the secondary battery.

In this case, since the SOC at the first and second timings are reflected in the reference variation, the accuracy of abnormality detection in the secondary battery can be increased over that attained with the background art in which an abnormality is detected on the basis of a variation amount of an internal resistance of a secondary battery occurring when charging is performed for a predetermined time, regardless of the SOC.

The first timing may be a timing at which the secondary battery is subjected to discharge, and the second timing may be a timing at which an interval equal to or longer than the preset time has elapsed since the first timing and the secondary battery is subjected to discharge.

Properties of secondary batteries are such that variations in internal resistance value are larger during discharging than during charging. Accordingly, with the above-described configuration, by determining an abnormality on the basis of a variation amount from the first resistance value to the second resistance value obtained during discharging, it is possible to increase the amount of variation that is used for the determination over that obtained during charging. As a result, the accuracy of abnormality detection in a secondary battery can be increased.

It is preferred that the battery abnormality detection circuit further include a voltage detection unit that detects a terminal voltage of the secondary battery, and the SOC detection unit acquire the SOC by converting a terminal voltage detected by the voltage detection unit into a SOC.

Since there is a correlation between a SOC of a secondary battery and a terminal voltage, the SOC detection unit can acquire a SOC by converting a terminal voltage detected by the voltage detection unit into a SOC.

It is also preferred that the battery abnormality detection circuit further include a temperature detection unit that detects a temperature of the secondary battery, and the SOC detection unit correct the SOC by adding a correction value to the SOC obtained by conversion of the terminal voltage and increase the correction value as the temperature detected by the temperature detection unit increases.

Even if the SOC is the same, a terminal voltage of a secondary battery decreases with the increase in temperature. Therefore, where the terminal voltage of the second battery is directly converted into the SOC, regardless of the actual temperature, on the basis of the correspondence relationship between the SOC and terminal voltage at a certain temperature, the SOC obtained by the conversion becomes lower than the actual SOC as the temperature rises. Accordingly, the SOC detection unit corrects the SOC by adding a correction value to the SOC obtained by conversion of the terminal voltage and increases the correction value with the increase in temperature detected by the temperature detection unit, thereby increasing the SOC detection accuracy.

It is preferred that the battery abnormality detection circuit further include a current detection unit that detects a current flowing in the secondary battery, and the SOC detection unit calculate the SOC by integrating the current detected by the current detection unit.

Since the integral value of electric current flowing in a secondary battery represents an actual charge-discharge amount of the secondary battery, where a SOC is calculated on the basis of the integral value, no error is caused by temperature, as it happens in the case in which the terminal voltage is converted into the SOC.

It is preferred that in the battery abnormality detection circuit, the reference variation value setting unit acquire an internal resistance value associated by relationship information stored in the storage unit with a $SOC_1$, which is the first SOC, as an internal resistance reference value $Rx_1$ and acquires an internal resistance value associated by the relationship information with a $SOC_2$, which is the second SOC, as an internal resistance reference value $Rx_2$, and calculate a reference variation upper limit value Xu and a reference variation lower limit value Xd that are reference variation values serving as indicators indicating an amount of variation from the internal resistance reference value $Rx_1$ to the internal resistance reference value $Rx_2$ by using Equations (A) and (B) below when $SOC_1 > SOC_2$ and using Equations (C) and (D) below when $SOC_1 < SOC_2$, and the determination unit calculate a variation value X that is an indicator indicating an amount of variation from the first resistance value $R_1$ to the second resistance value $R_2$ by using Eq. (E) below when $SOC_1 > SOC_2$ and using Equation (F) below when $SOC_1 < SOC_2$, and determine that an abnormality has occurred in the secondary battery when the calculated variation value X is outside a range from the reference variation upper limit value Xu to the reference variation lower limit value Xd and determines that no abnormality has occurred in the secondary battery when the calculated variation value X is within the range from the reference variation upper limit value Xu to the reference variation lower limit value Xd.

$$Xu = (Rx_2/Rx_1) + Cx \tag{A}$$

$$Xd = (Rx_2/Rx_1) - Cx \tag{B}$$

$$Xu = (Rx_1/Rx_2) + Cx \tag{C}$$

$$Xd = (Rx_1/Rx_2) - Cx \tag{D}$$

where Cx is a value representing an error of the reference variation value;

$$X = R_2/R_1 \tag{E}$$

$$X = R_1/R_2 \tag{F}$$

With such a configuration, the reference variation upper limit value Xu and the reference variation lower limit value Xd, which are reference variation values, are set by the reference variation value setting unit, and an abnormality of the secondary battery is easily determined on the basis of the reference variation upper limit value Xu and the reference variation lower limit value Xd by the determination unit.

With such battery abnormality detection circuit and power supply unit, the SOC at the first and second timings is reflected in the reference variation value that is used as a reference for abnormality determination. Therefore, the accuracy of abnormality detection in the secondary battery can be increased over that attained with the background art in which an abnormality is detected on the basis of a variation amount of an internal resistance of a secondary battery occurring when charging is performed for a predetermined time, regardless of the SOC.

The present application is based on Japanese Patent Application No. 2009-071540 filed on Mar. 24, 2009, and the contents thereof are incorporated in the present application.

Specific embodiments and examples described in the detailed description of the invention serve to clarify the technical contents of the present invention. The present invention should not be construed as being limited only to these specific examples and can be implemented with various changes, without departing from the spirit thereof and within a scope defined by the claims described hereinbelow.

INDUSTRIAL APPLICABILITY

The battery abnormality detection circuit and power supply device in accordance with the present invention can be advantageously uses as a battery abnormality detection circuit for a secondary battery and a power supply device using same in wide variety of fields, e.g. mobile devices such as cellular phones and personal computers, power tools such as electric tools and vacuum cleaners, power driven apparatuses such as electric automobiles, electric industrial vehicles, electric bikes, and power-assisted bicycles, and system power supply sources such as peak shift devices and backup devices.

The invention claimed is:

1. A battery abnormality detection circuit, comprising:
a state of charge (SOC) detection unit that detects a SOC of a secondary battery;
an internal resistance detection unit that detects an internal resistance value of the secondary battery;
a first state acquisition unit that acquires, at a predetermined first timing, a SOC detected by the SOC detection unit as a first SOC and acquires an internal resistance value detected by the internal resistance detection unit as a first resistance value;
a second state acquisition unit that acquires a SOC detected by the SOC detection unit as a second SOC and acquires an internal resistance value detected by the internal resistance detection unit as a second resistance value at a second timing at which at least a preset time has elapsed since the first timing;
a storage unit that stores in advance relationship information indicating a correspondence relationship between a SOC and an internal resistance value of the secondary battery;

a reference variation value setting unit that sets a reference variation value indicating an amount variation from an internal resistance value corresponding to the first SOC to an internal resistance value corresponding to the second SOC on the basis of the relationship information stored in the storage unit; and a determination unit that determines that an abnormality has occurred in the secondary battery when an amount of variation from the first resistance value to the second resistance value is different from an amount of variation indicated by the reference variation value that has been set by the reference variation value setting unit.

2. The battery abnormality detection circuit according to claim 1, wherein the first timing is a timing at which the secondary battery is subjected to discharge: and the second timing is a timing at which an interval equal to or longer than the preset time has elapsed since the first timing and the lithium secondary battery is subjected to discharge.

3. The battery abnormality detection circuit according to claim 2, further comprising a voltage detection unit that detects a terminal voltage of the secondary battery, wherein the SOC detection unit acquires the SOC by converting a terminal voltage detected by the voltage detection unit into a SOC.

4. The battery abnormality detection circuit according to claim 3, further comprising a temperature detection unit that detects a temperature of the secondary battery, wherein the SOC detection unit corrects the SOC by adding a correction value to the SOC obtained by conversion of the terminal voltage and increases the correction value as the temperature detected by the temperature detection unit increases.

5. The battery abnormality detection circuit according to claim 1, further comprising a current detection unit that detects a current flowing in the secondary battery, wherein the SOC detection unit calculates the SOC by integrating the current detected by the current detection unit.

6. The battery abnormality detection circuit according to claim 1, wherein the reference variation value setting unit acquires an internal resistance value associated by relationship information stored in the storage unit with a $SOC_1$, which is the first SOC, as an internal resistance reference value $Rx_1$ and acquires an internal resistance value associated by the relationship information with a $SOC_2$, which is the second SOC, as an internal resistance reference value $Rx_2$, and calculates a reference variation upper limit value Xu and a reference variation lower limit value Xd that are reference variation values serving as indicators indicating an amount of variation from the internal resistance reference value $Rx_1$ to the internal resistance reference value $Rx_2$ by using Equations (A) and (B) below when $SOC_1 > SOC_2$ and using Equations (C) and (D) below when $SOC_1 < SOC_2$, and the determination unit calculates a variation value X that is an indicator indicating an amount of variation from the first resistance value $R_1$ to the second resistance value $R_2$ by using Equation (E) below when $SOC_1 > SOC_2$ and using Eq. (F) below when $SOC_1 < SOC_2$, and determines that an abnormality has occurred in the secondary battery when the calculated variation value X is outside a range from the reference variation upper limit value Xu to the reference variation lower limit value Xd and determines that no abnormality has occurred in the secondary battery when the calculated variation value X is within the range from the reference variation upper limit value Xu to the reference variation lower limit value Xd:

$$Xu = (Rx_2/Rx_1) + Cx \quad (A)$$

$$Xd = (Rx_2/Rx_1) - Cx \quad (B)$$

$$Xu = (Rx_1/Rx_2) + Cx \quad (C)$$

$$Xd = (Rx_1/Rx_2) - Cx \quad (D)$$

where Cx is a value representing an error of the reference variation value;

$$X = R_2/R_1 \quad (E)$$

$$X = R_1/R_2 \quad (F).$$

7. A power supply device, comprising:

the battery abnormality detection circuit according to claim 1;

and the secondary battery.

* * * * *